United States Patent [19]
Moslehi

[11] Patent Number: 5,715,361
[45] Date of Patent: Feb. 3, 1998

[54] RAPID THERMAL PROCESSING HIGH-PERFORMANCE MULTIZONE ILLUMINATOR FOR WAFER BACKSIDE HEATING

[75] Inventor: Mehrdad M. Moslehi, Los Altos, Calif.

[73] Assignee: CVC Products, Inc., Fremont, Calif.

[21] Appl. No.: 421,210

[22] Filed: Apr. 13, 1995

[51] Int. Cl.[6] .......................... H01L 21/324; H05B 3/00; C23C 16/48
[52] U.S. Cl. .................. 392/416; 219/405; 118/725
[58] Field of Search ....................... 392/416, 418; 219/390, 405, 411, 343; 118/724, 725, 728, 730, 50.1; 437/247; 427/521, 557

[56] References Cited

U.S. PATENT DOCUMENTS

| | | | |
|---|---|---|---|
| 4,752,592 | 6/1988 | Tamura et al. | 437/247 |
| 4,796,562 | 1/1989 | Brors et al. | 118/725 |
| 4,891,499 | 1/1990 | Moslehi | 219/502 |
| 5,255,286 | 10/1993 | Moslehi et al. | 374/121 |
| 5,268,989 | 12/1993 | Moslehi et al. | 392/418 |
| 5,367,606 | 11/1994 | Moslehi et al. | 392/418 |
| 5,445,677 | 8/1995 | Kawata et al. | 118/724 |
| 5,446,825 | 8/1995 | Moslehi et al. | 392/416 |
| 5,480,489 | 1/1996 | Hasegawa | 118/725 |

*Primary Examiner*—Teresa J. Walberg
*Assistant Examiner*—J. Pelham
*Attorney, Agent, or Firm*—Baker & Botts, L.L.P.

[57] ABSTRACT

A multizone illuminator rapid thermal processing system for fabricating a semiconductor device having a face on which an electronic medium is deposited. The system includes a processing chamber for establishing a semiconductor device fabrication environment for rapid thermal processing, an optically reflective gas injector for injecting a process gas into the semiconductor device fabrication environment, a semiconductor device holding mechanism for holding the semiconductor device in the semiconductor device fabrication environment, and a multizone illuminator positioned in association with the process chamber for illuminating the backside of the semiconductor device to perform a rapid semiconductor thermal process. The system can also include a multipoint temperature sensor system used in conjunction with a multizone variable temperature controller to increase dynamic temperature uniformity and repeatability control.

19 Claims, 6 Drawing Sheets

RAPID THERMAL PROCESSING HIGH-PERFORMANCE MULTIZONE ILLUMINATOR FOR WAFER BACKSIDE HEATING

TECHNICAL FIELD OF THE INVENTION

The present invention relates to microelectronic device processing and more particularly to a rapid thermal processing high-performance multizone illuminator for wafer backside heating for uniform semiconductor wafer processing for a wide range of single-wafer lamp-heated device processing applications.

BACKGROUND OF THE INVENTION

Single-wafer optical processing of semiconductors is a powerful and versatile technique for fabrication of very-large-scale integrated (VLSI) and ultra-large-scale integrated (ULSI) electronic devices. It combines low thermal mass photon-assisted rapid wafer heating with reactive ambient semiconductor processing. Both the wafer temperature and the process environment can be quickly changed (because of short transient times) and, as a result, each fabrication step and its sub-processes can be independently optimized in order to improve the overall electrical performance of the fabricated devices.

Rapid thermal processing (RTP) of semiconductor wafers provides a capability for better wafer-to-wafer process repeatability in a single-wafer lamp-heated thermal processing reactor. Numerous silicon fabrication technologies can use RTP techniques, including thermal oxidation, nitridation, dopant diffusion, and different types of thermal anneals. Refractory metal silicide formation and chemical-vapor deposition (CVD) are other significant silicon device fabrication processes that can benefit from RTP in a single-wafer reactor. For example, CVD processes to form dielectrics (e.g., oxides and nitrides) and semiconductive materials such as amorphous silicon and polysilicon, as well as conductors (e.g., aluminum, copper, tungsten, and titanium nitride), can be performed using advanced RTP techniques.

In the conventional RTP systems, equipment manufacturers have spent significant design resources to insure that the illuminator designs provide uniform wafer heating during steady-state conditions. These known systems are designed with illuminators which provide single-zone or very limited multi-zone control capability. Thus, with an increase or decrease of the power to the illuminator, the entire wafer temperature distribution is affected. As a result, there are insufficient real-time control capabilities to adjust or optimize wafer temperature uniformity during the steady-state and dynamic transient heat-up and cool-down cycles. Although known systems can provide some degree of wafer temperature uniformity under steady-state conditions, those systems do not insure that the wafer temperature will be uniform during transient heat-up and cool-down periods. As a result, the transient heat-up or cool-down process segments can result in formation of slip dislocations (at high temperatures, e.g.,≧850° C.) as well as process nonuniformities. Moreover, known RTP systems do not provide any sufficient capability to adjust or optimize wafer temperature uniformity during transient conditions over extended temperature ranges. Various process parameters can influence and degrade the RTP uniformity. Known RTP systems are optimized to provide steady-state temperature uniformity at a fixed pressure such as atmospheric process pressure. Thus, a change in process pressure as well as gas flow rates can degrade the RTP uniformity.

Thus, there is a need for an improved illuminator module that provides capabilities for real-time process uniformity optimizations during the RTP fabrication processes.

There is a need for a multi-zone lamp heat source that provides wafer temperature uniformity during transient and steady-state heating conditions in a rapid thermal processing reactor.

There is a need for a multi-zone lamp module that provides cylindrical symmetry in controlling semiconductor wafer temperature and its uniformity.

Moreover, there is a need for a multi-zone illuminator heat source for use in device fabrication processes that may be effectively combined with a multi-point temperature sensor system for real-time precision semiconductor wafer temperature and processing uniformity control.

SUMMARY OF THE INVENTION

In accordance with the present invention, a rapid thermal processing system utilizing a high-performance multizone illuminator for wafer backside heating is provided that substantially eliminates or reduces disadvantages and problems associated with previously developed RTP systems.

The present invention accordingly provides an apparatus and method for high-performance multi-zone heating of a semiconductor wafer from its back-side (i.e., from its device side) for improved semiconductor wafer processing temperatures uniformity across the wafer during steady-state and transient wafer heating conditions that substantially eliminate and reduce disadvantages and limitations associated with prior lamp heating modules.

A technical advantage of the present invention is that it provides flexible wafer temperature control and real-time process uniformity optimization during steady-state as well as transient heat-up and cool-down thermal cycles for RTP-based device fabrication processes over a wide range of temperatures. For instance, for rapid thermal oxidation of semiconductor wafers, the present invention has the technical advantages of improving oxide thickness uniformity and eliminating or minimizing semiconductor wafer slip dislocations. It also provides capabilities for improved wafer-to-wafer process repeatability.

Yet another technical advantage of the present invention is that it provides full flexibility for real-time multi-zone process uniformity control at a low cost to the user.

Other technical advantages of the present invention include:

Applications: RTAs, RTOs, RTCVDs, and MOCVD-TiN used with either a S/A handler or Connexion cluster Main features of CVC's RTP process module:

Capable of processing wafers up to 200 mm in diameter

Modular and flexible design to meet multiple application requirements

Axisymmetric multi-zone illuminator for uniform processing

Multi-zone showerhead for low-particulate & uniform RTCVD/MOCVD

Multi-point temp. sensors with emissivity & lamp light compensation

Multi-zone dynamic temperature controller for uniform & repeatable RTP

Particulate-free wafer rotation

In-situ plasma cleaning for RTCVD and MOCVD applications

Real-time in-situ thickness sensor for RTCVD and MOCVD applications

Real-time in-situ diagnostics for built-in reliability. Another technical advantage that the present invention provides is

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein.

DETAILED DESCRIPTION OF THE INVENTION

The preferred embodiments of the present invention are illustrated in the FIGUREs like numerals being used to refer to like and corresponding parts of the various drawings.

The continuing down scaling of device dimensions in VLSI/ULSI circuits places increasingly challenging demands on the manufacturing tools and technologies required to manufacture complex microelectronics chips. Rapid technological advancements have reduced the minimum feature sizes of the digital integrated circuits (IC's) well into the sub-micron regime. As a result, short-time and/or activated low-temperature processes are considered to be essential for minimizing the dopant redistribution problems, increasing the chip fabrication yield, and achieving enhanced process reducibility and control during the device fabrication sequence.

Rapid thermal processing (RTP) offers an extended process parameter space which is different from that of the conventional batch furnace processing techniques. RTP operates based on the single-wafer processing methodology which is considered desirable for flexible fast turn-around integrated circuit manufacturing. A large number of non-thermal processes (such as ion implantation, microlithography, plasma etching, etc.) in an integrated circuit fabrication sequence are now done in the single-wafer mode. However, most of the thermal fabrication steps (e.g., epitaxy, CVD, diffusion, oxidation, etc.) are still performed in conventional batch furnaces, mainly due to throughput requirements and manufacturing and process control problems associated with the commercial RTP techniques.

Figure 1:
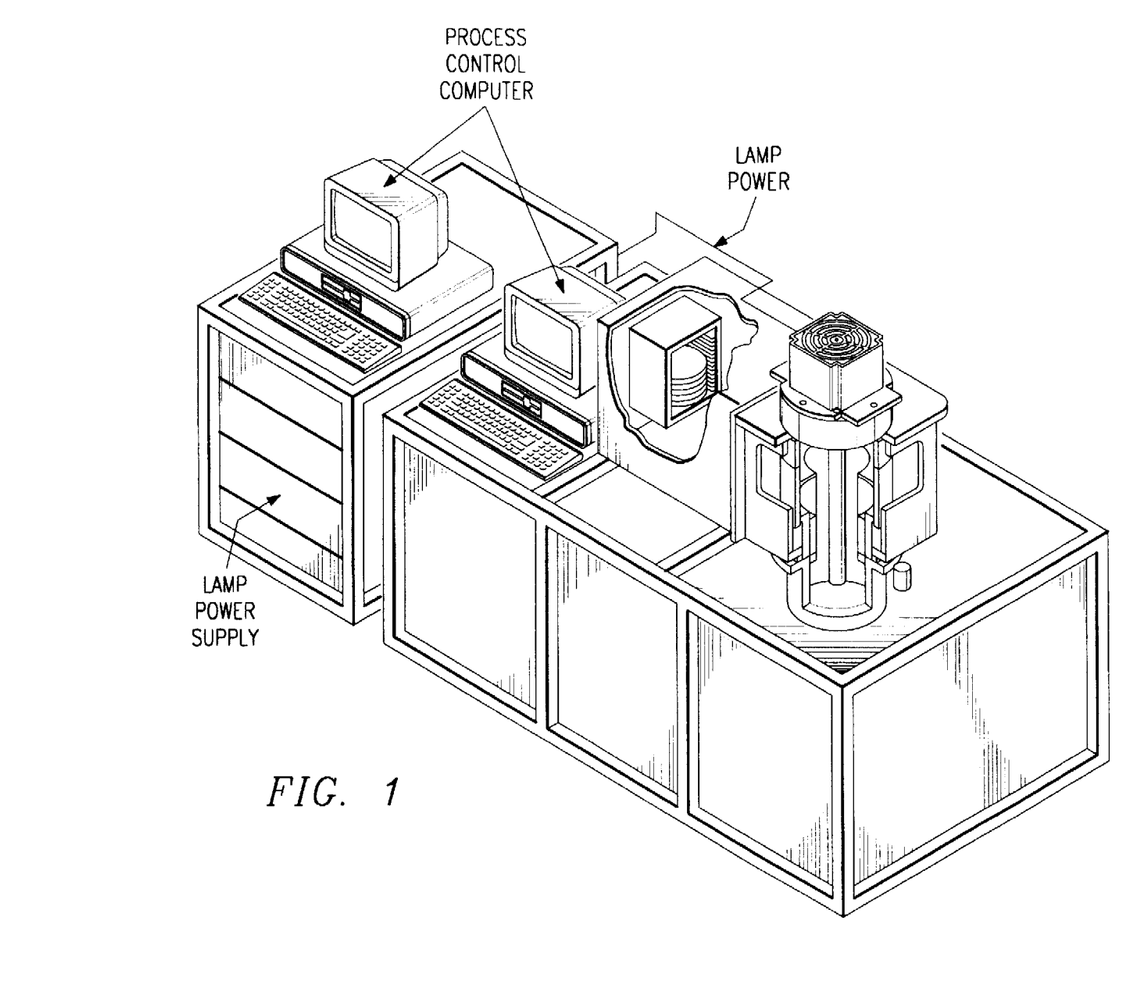
FIG. 1 illustrates an AVP for use with the present embodiment.
Figure 2:
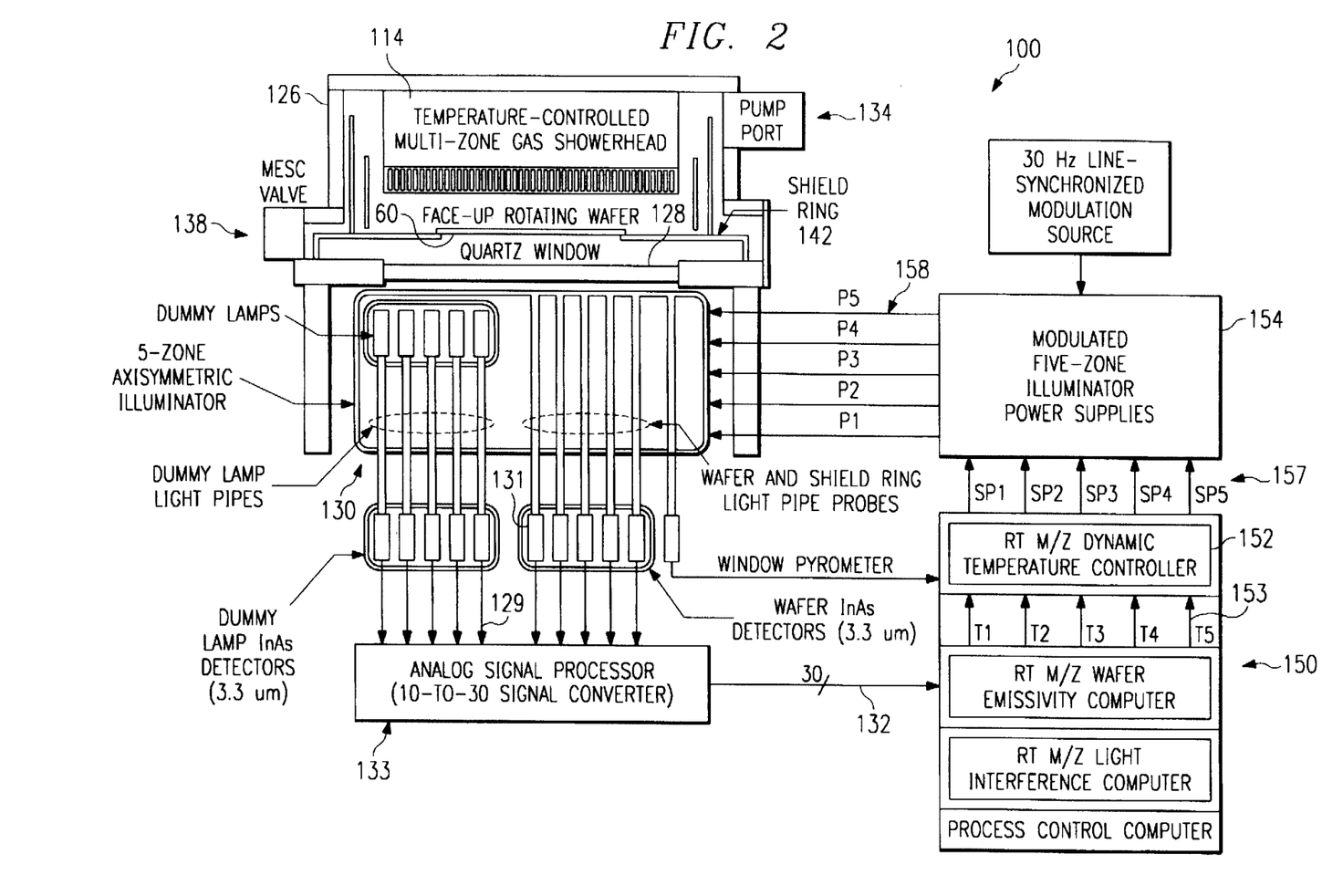
FIG. 2 shows a rapid thermal processing multi-point system sensor for sensor use with the present multizone equipment embodiment.
Figure 3:
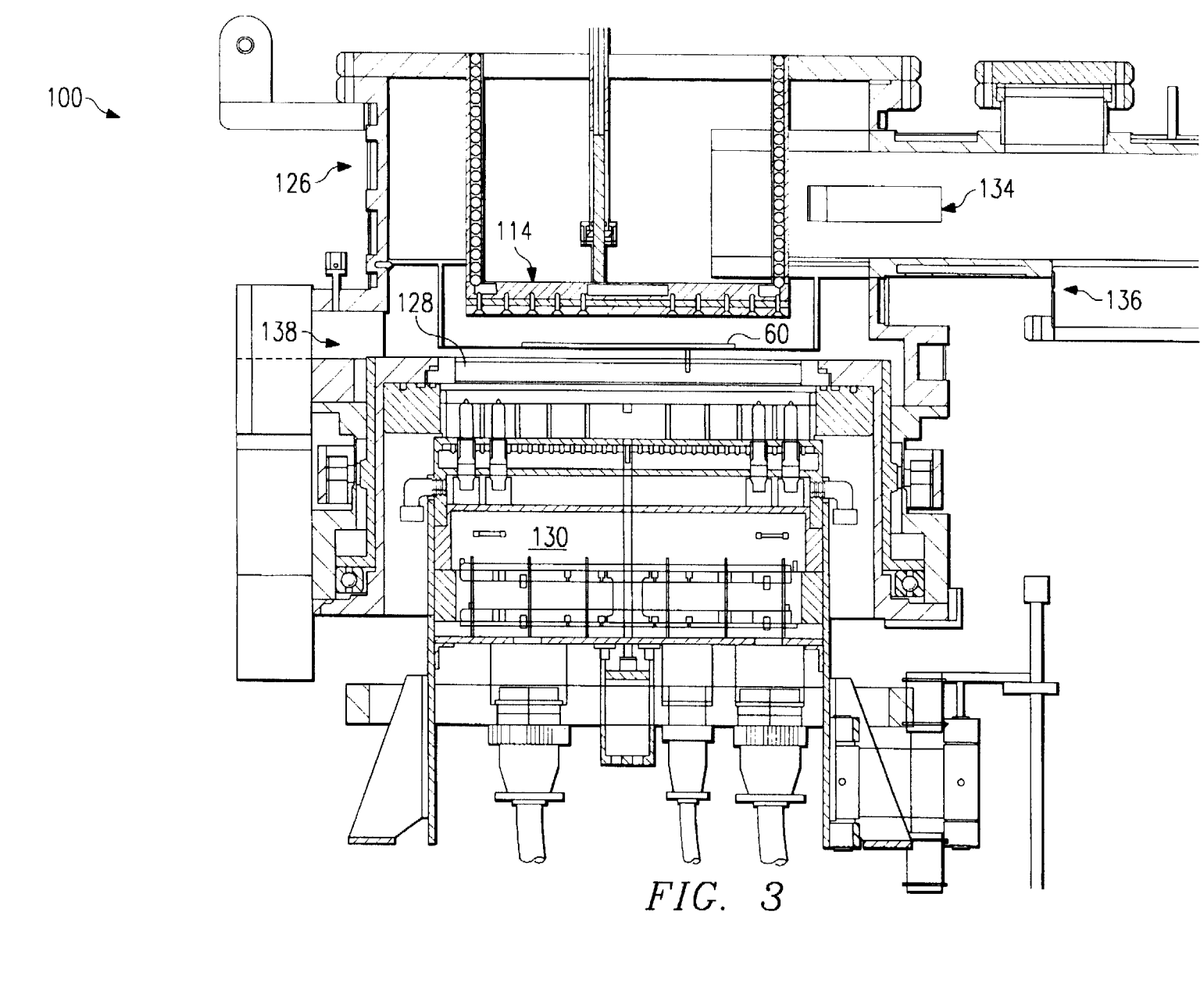
FIG. 3 show a schematic diagram of the present embodiment.
Figure 4:
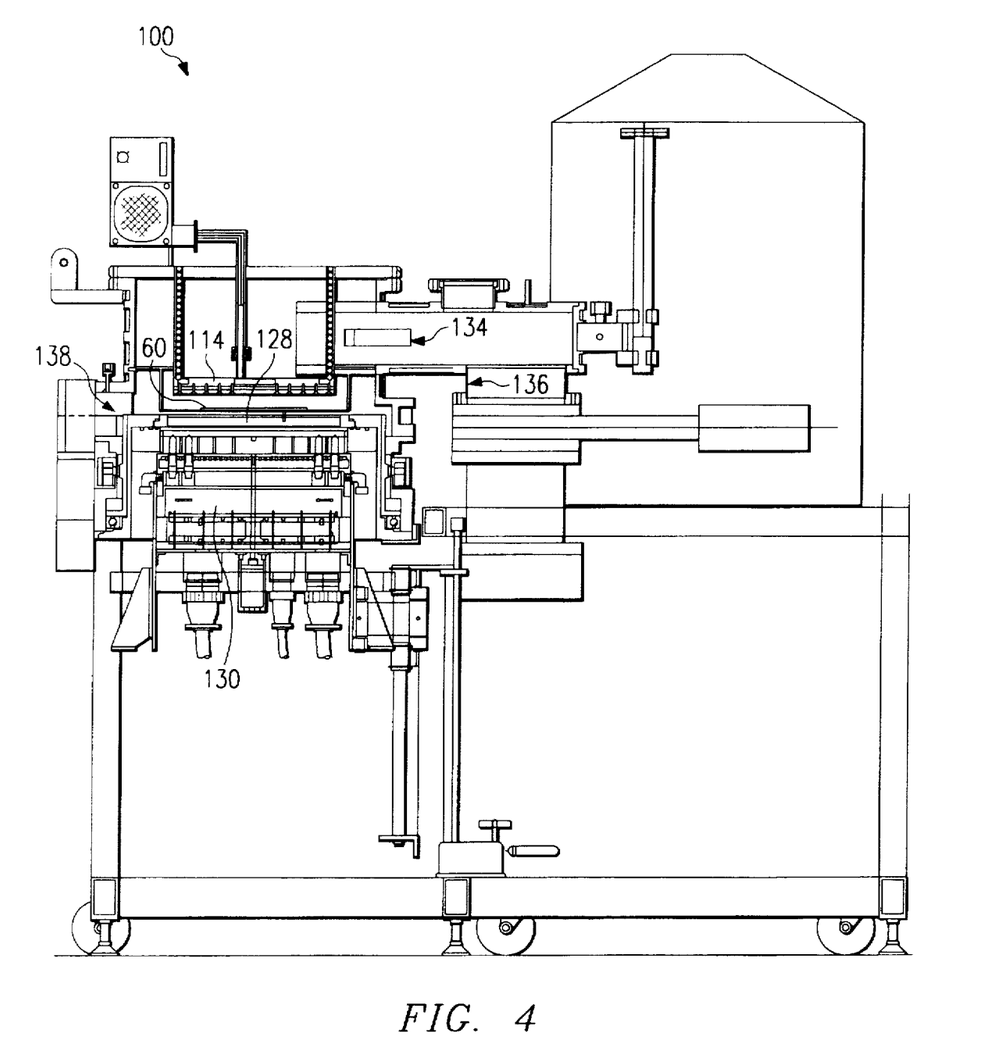
FIG. 4 shows another cross-sectional view of the present embodiment with fabrication reactor.
Figure 5:
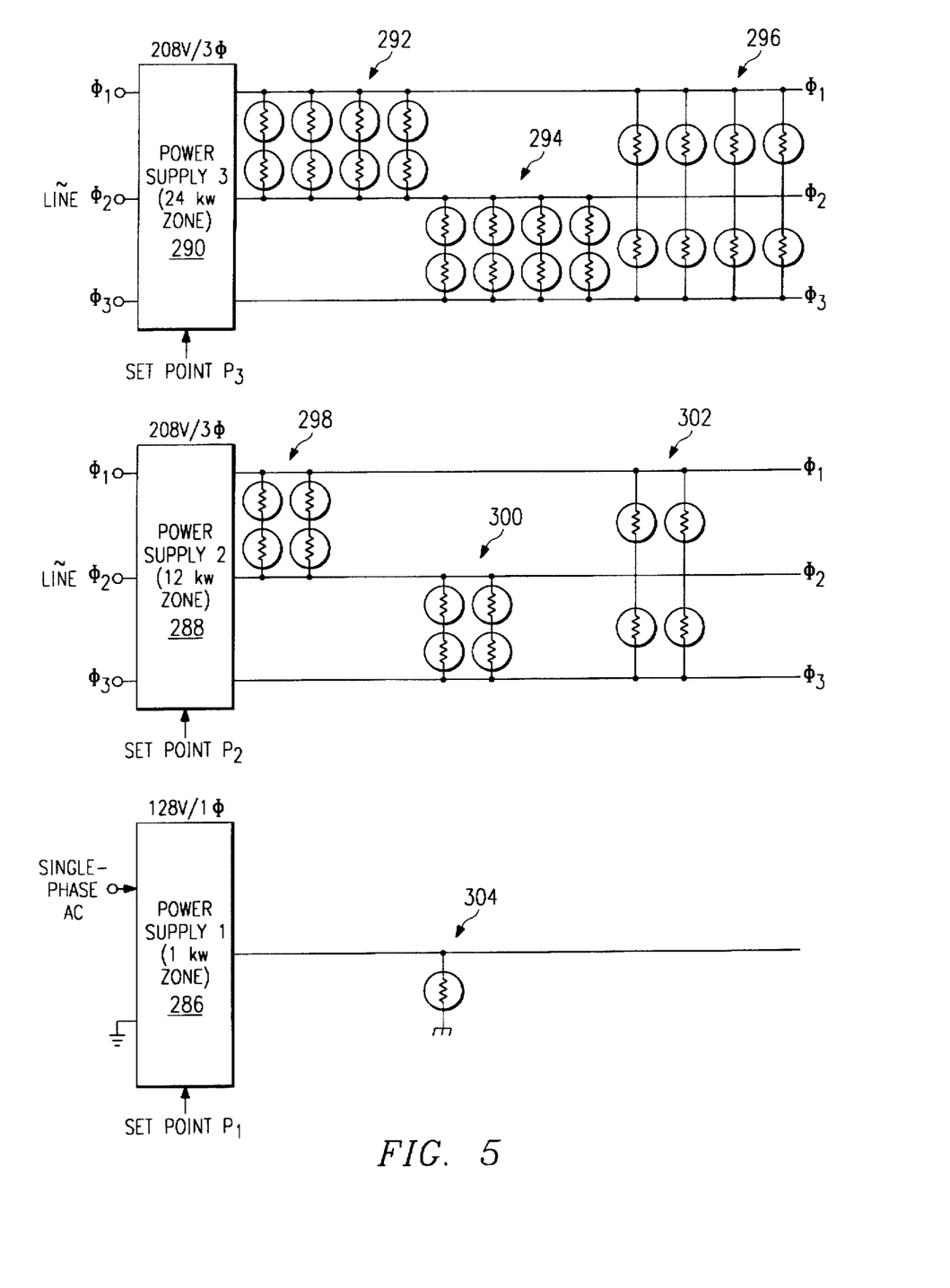
FIG. 5 illustrates an electrical schematic diagram of the multizone illuminator lamp wiring connections for the present embodiment of the invention.
Figure 6:
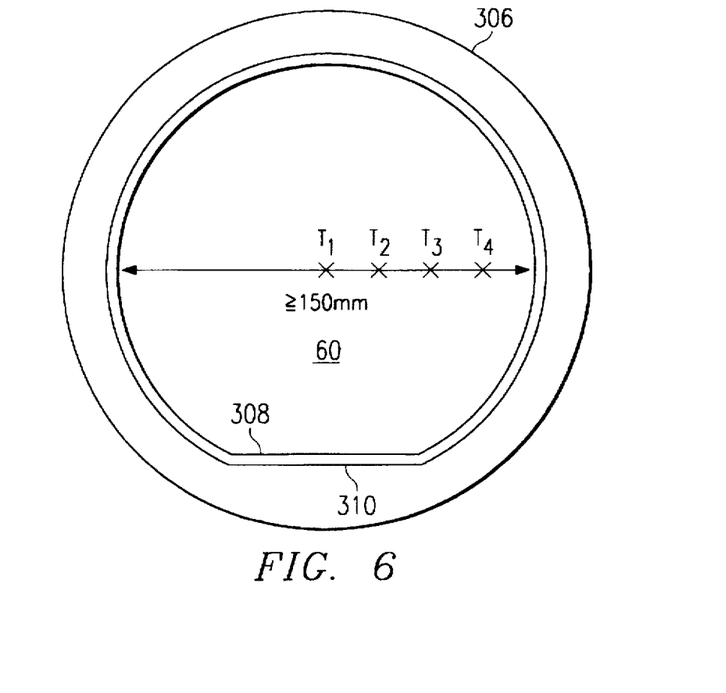
FIG. 6 shows a plan view of a wafer processed by the present invention, indicating various radial positions for the multizone wafer temperature probes $T_1$ through $T_4$.
Figure 7:
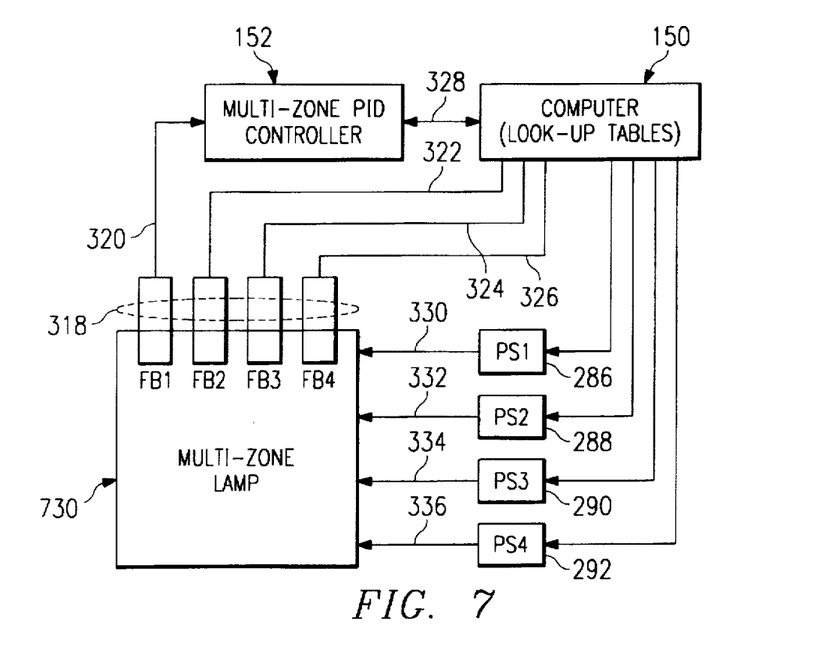
FIG. 7 shows a temperature control system for controlling the present embodiment.

FIG. 1 illustrates an Advanced Vacuum Processor (AVP) for use with the present embodiment. FIG. 2 shows a rapid thermal processing multi-point temperature sensor system for use with the multizone RTP system of the present embodiment. FIG. 3 shows a schematic diagram of the multizone RTP system with backside heating and with a frontside reflective showerhead for the present embodiment. FIG. 4 shows the present embodiment set up as an RTP fabrication reactor. FIG. 5 illustrates an electrical schematic diagram of the multizone illuminator lamp wiring for the present embodiment of the invention. FIG. 6 shows a view of a wafer processed by the present invention. FIG. 7 shows various aspects of a control system for controlling the present embodiment.

A multizone illuminator rapid thermal processing system for fabricating a semiconductor device having a face on which an electronic medium is deposited and a backside. The system includes a processing chamber for establishing a semiconductor device fabrication environment for rapid thermal processing, a gas injector for injecting a process gas into the semiconductor device fabrication environment, a semiconductor device holding mechanism for holding the semiconductor device in the semiconductor device fabrication environment, and a multizone illuminator positioned in association with the process chamber for illuminating the backside of the semiconductor device to perform a rapid semiconductor thermal process. The semiconductor device holding mechanism includes a wafer receiving mechanism for receiving the semiconductor wafer in a face down orientation and the multizone illuminator is further positioned in association with the process chamber for illuminating the semiconductor wafer from the top downward. The semiconductor device holding mechanism also includes a wafer receiving mechanism for receiving the semiconductor wafer in a face upward orientation and the multizone illuminator is further positioned in association with the process chamber for illuminating the semiconductor wafer from the bottom upward.

The gas injector includes a showerhead gas injector. The gas injector also includes an optically reflective showerhead assembly in order to eliminate the effects of frontside device patterns and frontside emissivity variations on temperature uniformity.

The process chamber further includes componentry for establishing an essentially atmospheric pressure semiconductor device fabrication environment. The process chamber further includes componentry for establishing a vacuum semiconductor device fabrication environment.

The method of forming a multizone illuminator rapid thermal processing system for fabricating a semiconductor device having a face on which to form an electronic structure and a backside. The method includes the steps of forming a process chamber for establishing a semiconductor device fabrication environment for rapid thermal processing, forming a gas injector for injecting a process gas into the semiconductor device fabrication environment, forming a semiconductor device holding mechanism for holding the semiconductor device in the process chamber, forming a multizone illuminator positioned in association with the processing chamber for illuminating the backside of the semiconductor device to perform a rapid semiconductor device thermal process. In addition to the face-up and face-down wafer orientation options previously described, the backside may be heated by positioning the wafer vertically and positioning the illuminator at one side or the other of the processing chamber.

The method further including the step of forming a wafer receiving mechanism for receiving the semiconductor wafer in a face down orientation and the multizone illuminator is further positioned in association with the process chamber for illuminating the semiconductor wafer backside from the top downward. The method further includes the step of forming a wafer receiving mechanism for receiving the semiconductor wafer in a face upward orientation and the multizone illuminator is further positioned in association with the process chamber for illuminating the semiconductor wafer backside from the bottom upward. The method of forming said gas injector further comprises the step of forming a showerhead gas injector for injecting process gas into the semiconductor device fabrication environment.

The gas injector forming step further comprises the step of forming a showerhead gas injector as an optically reflective showerhead gas injector for injecting process gas into the semiconductor device fabrication environment, and for eliminating the effects of front side device patterns on wafer temperature uniformity. The gas injector forming step further comprises the step of forming a showerhead gas injector as an optically reflective multizone showerhead gas injector for injecting process gas into the semiconductor device fabrication environment.

A method for performing a rapid thermal process on a semiconductor device, the semiconductor device having a face on which to form as electronic structure and a backside, the method comprising the steps of establishing a semiconductor device fabrication environment in a process chamber, injecting a process gas into the semiconductor device fabrication environment, holding the semiconductor device in the process chamber, illuminating the backside of the semiconductor device using a multizone illuminator positioned in association with the process chamber for performing the rapid thermal process on the semiconductor device.

The method further comprises the step of receiving the semiconductor wafer in a face down orientation and said multizone illuminator is further positioned in association with said process chamber for illuminating the semiconductor wafer from the top downward. The method further comprises the step of receiving the semiconductor wafer in a face upward orientation and said multizone illuminator is further positioned in association with said process chamber for illuminating the semiconductor wafer from the bottom upward. The method further comprises the step of injecting the process gas into the semiconductor device fabrication environment using a showerhead gas injector. The method further comprises the step of injecting the process gas into the semiconductor device fabrication environment using a multizone showerhead gas injector. The method further comprises the step of injecting the process gas into the semiconductor device fabrication environment using an optically reflective showerhead gas injector. The method further comprises the step of establishing the semiconductor device fabrication environment as a vacuum.

The present embodiment satisfies the following specifications:

Front-end integrated processing:
Epitaxial substrate (RTCVD); Si/SiGe heterostructures (analog bipolar).
PBL isolation stack (RTO and RTCVDs)
CMOS gate stack (RTO/RTN and RTCVD)
Storage capacitor stack (RTO/RTN and RTCVDs)
Polycide stack (RTCVDs)
Dielectric spacer (RTCVD)
Junction gas-phase doping (RTA)
Storage capacitor doping (RTA and RTO)
Elevated source/drain junctions (RTCVD)
Back-end integrated processing:
Self-aligned silicide (RTA)
Contact metallization (RTA and/or MOCVD and/or RTCVD)
Via metallization (MOCVD and/or RTCVD)
Interlevel Dielectric (ILD) BPSG deposition & reflow (RTA)
Within-wafer (200-mm) temperature non-uniformity:
3-sigma<3 degrees C.@T>400 degrees C.
Wafer-to-wafer temperature variations:
3-sigma<3 degrees C.@T>400 degrees C. for various wafer backside and frontside emissivity values
Maximum transient within-wafer non-uniformity:
<5 degrees C. (during fastest controlled transient ramps)
Typical Multizone controlled heat-up & cool-down rates:
25 to 100 degrees C./sec
Typical routine processing temperature range:
400 to 1100 degrees C. (capable of up to 1200 degrees C. max.)
Throughput rate:>30 wafers/hr
Wafer rotation range:
20 to 100 rpm (typical) for standard processing
>1000 rpm for rotating disk reactor (RDR) processing An example of RTP semiconductor wafer fabrication is described by M. M. Moslehi, in the article "Linearly Ramped Temperature Transient Rapid Thermal Oxidation of Silicon," *Appl. Phys. Letters* Vol. 53(12), September 1988, pp. 1104–1106 ("*Moslehi*"). That article is a study of the silicon rapid oxidation processes that use transient cycles with controlled linear heat-up (and in some cases cool-down) segments. *Moslehi* shows the growth kinetics of a ramped-temperature transient rapid thermal oxidation process that uses RTP techniques. In that process, wafer temperature was raised at a rate of 50° C./s up to 750° C. where it was held for 5 seconds. A controlled linear heat-up ramp followed the preheating segment of the thermal cycle. The heat-up rate and the peak wafer temperature were varied in the ranges of 10° to 200° C./s and 950° to 1200° C., respectively.

To explain how the present invention solves these technical problems, associated with known RTP methods, reference is made to the semiconductor wafer fabrication environment. FIG. 2 is a schematic representation of a semiconductor fabrication reactor 100 that establishes the environment of the present invention. Within a single-wafer rapid thermal processing reactor 100 may reside semiconductor wafer 60. Gas distribution network 102 (not shown) provides process gases to reflective showerhead 144. Below gas injector assembly 114 and supported by water support structure 142 appears semiconductor wafer 60.

Process chamber 126 includes optical quartz window 128 which separates semiconductor wafer 60 from tungsten-halogen heating lamp module 130 of the present invention. Vacuum pump connection 134 removes flowing process gas and from process chamber 126 and into pumping package. Additionally, isolation gate 138 permits passage of semiconductor wafer 60 from vacuum load-lock chamber or central wafer handler (not shown) into process chamber 126. To permit movement of semiconductor wafer 60 into process chamber 126, vertically moveable wafer support structure 142 is utilized.

Process control computer 150 controls the processing of semiconductor wafer 60 in RTP reactor 100. Control signals from process control computer 150 include signals to multi-zone controller 152. Multi-zone controller 152 provides various signals to multi-zone lamp module power supply 154. Lamp module power supply 154 responsively provides power settings to multi-zone tungsten-halogen heating lamp module 130.

Process control computer 150 also directs pressure setpoints to pumping package 136 as well as gas inlet flow signals to mass-flow controllers in the gas distribution network.

Process control computer 150 checks the status of multi-zone lamp module 130 for diagnosis/prognosis purposes and provides multiple temperature control signals 153 to multi-zone controller 152 in response to temperature readings 129 of multi-point sensors (not shown). The multi-zone controller or 152 receives measured multi-point temperature sensor outputs 129 as well as the desired wafer temperature setpoint (from computer) and delivers power setpoints 157 to the lamp power supplies at 154. Additional interface signal lines 132 between process control computer 150 and multi-zone lamp module 130 of the present invention includes process signals 132 from multi-point temperature sensor 131 for real-time semiconductor wafer 60 temperature measurements.

The number of lamp zones may be three, four, five, six, or even higher depending on the wafer size. While four-zone lamp module 130 was designed for low to medium temperature applications such as low-pressure CVD and silicide formation, and for operating in temperatures between 300° C. and 950° C., the five-zone illuminator module 130 provides a high degree of dynamic control flexibility and has extended temperature range of operation between 300° C. and 1200° C. Additionally, five-zone illuminator 130 is capable of processing of 8" to 10" wafers. Moreover, the four-zone lamp may be easily scaled for processing larger semiconductor wafers. Five-zone illuminator 130 generally provides improved flexibility for real-time dynamic wafer temperature uniformity optimization and control.

Applications for which five-zone illuminator module 130 is particularly suitable include (but are not limited to) numerous high temperature applications such as rapid thermal oxidation, rapid thermal nitridation, rapid thermal annealing, and single-wafer epitaxy. Additionally, lower temperature applications such as LPCVD polysilicon/amorphous silicon can also employ the multizone RTP system 100 with a five-zone illuminator 130 with, again, increased flexibility for dynamic temperature uniformity control. Five-zone illuminator 130 uses five individual remote controlled power supplies. One power supply 154 is used to control each of the five concentric zones. The five-zone illuminator 130 also uses a single tungsten-halogen lamp included in the for center lamp zone (center zone has a ring of buls plus a center bulb).

The lamp module uses five independent power supplies 154. As an example, a multi-zone RTP system with a three-zone illuminator power supply arrangement and power requirements would be as follows. Power Supply 1 supplies up to 1 kW of power to the central zone and Power Supply 2 delivers up to 12 kilowatts of power to the middle zone. The third power supply provides up to 24 kW of electrical power to the outer zone. Both Power Supply 2 and Power Supply 3 provide three-phase power from 208 V three-phase supply line in response to respective setpoints $P_2$ and $P_3$. Power Supply 1 286 is a one-kilowatt 120 volt single-phase AC power supply that in response to setpoint $P_1$ provides adjustable power to lamp 196 of center lamp zone 190. Power Supply 3 290 supplies eight lamps (110 V tungsten-halogen lamps) between each pair of phases. The eight lamps across each pair of phases are configured as four parallel lines of series lamp pairs. Lamp groups are supplied by different phase pairs, respectively. This configuration ensures balanced operation of the three-phase power supply. However, other wiring configurations may also be employed (depending on the maximum voltage ratings of the lamps and power supplies).

Power Supply 2 also provides up to 208 volts, three-phase, AC power, but only serves two branches of 2-lamp series pairs between each pair of phases. Two sets of 2-lamp series pairs across each pair of phases for a total of 12 one-kilowatt lamps are supplied by 12 kilowatt zone Power Supply 2 288. Finally, for a three-zone lamp module, center lamp zone receives only up to 120 volts of one-kilowatt single-phase AC power. For a three-zone illuminator, although the respective maximum powers for Power Supply 3, Power Supply 2 and Power Supply 1 are 24 kilowatts, 12 kilowatts, and one kilowatt, these power ratings are dependent on the lamps used within each of the associated optical zones (see FIG. 5). If, for example, each individual lamp consumes up to two kilowatts of power instead of one kilowatt of power, the respective zone power supply must be doubled in output. Moreover, the three-phase power circuit for four-zone embodiment has a fairly similar configuration, but with four independent power supplies (one for each lamp zone). To balance loads across each pair of phases of each power supply, the 4-Lamp zone embodiment uses dummy power loads (such as dummy lamps).

A particularly advantageous feature of the present invention is its ability to be used with a multi-point temperature sensor described in U.S. Pat. No. 5,255,286 by Moslehi, et al. and entitled "Multi-Point Pyrometry With Real-Time Surface Emissivity Compensation" (hereinafter the "Pyrometry Patent"). Using the invention of the Pyrometry Patent with the multi-zone lamp layout of the present invention and process control computer 150, it is possible to provide real-time wafer temperature uniformity during steady-state and transient semiconductor wafer heating.

FIG. 2 shows a block diagram for achieving dynamic semiconductor wafer temperature and process uniformity control using the combination of the multi-point temperature sensor together with multi-zone lamp module 130 of the present invention (Example given for a five-zone lamp). In its normal use, multi-zone lamp 130 sits above reactor process chamber 126 and is configured to receive multi-point pyrometer light pipes 131 within the module itself. Fiber optic pyrometry sensors, 131 interface to electrical cables 129 that provide semiconductor wafer temperature measurements at various points on wafer surface. Output electrical signals 129 analog signal processor 133. Multi-zone controller 152 communicates with process control computer 150 by receiving compensated multipoint temperature signals 153. Temperature sensors 131 provide measurement signals which are sent via lines 129 to analog signal processor 133. In response to signals from multi-zone controller 152 process control computer sends power setpoint signals 157 to power supplies, 154. These modulated power supplies 454 provide adjustable electrical power channels to multi-zone lamp 130 via lines 158.

FIG. 6 shows a SiC-coated graphite ring 306 surrounding semiconductor wafer 60. This configuration is used within RTP process chamber 126. Additionally, temperature sensing points T1, T2, T3, and T4 correspond to points for sensing the radial temperature profile of semiconductor wafer 60 from its center out to the wafer edge in real time. Because lamp module 130 of the present invention provides cylindrical symmetry, a measurement of the radial wafer temperature profile will provide a reliable indication of the overall wafer temperature uniformity.

Graphite ring 306 has an inner diameter that is slightly larger than the outer diameter of the semiconductor wafer 60. It does not, however, make contact with semiconductor wafer 60. Graphite ring 306 acts as a proximity radiation shield to reduce the amount of thermal energy or blackbody radiation lost from semiconductor wafer 60 at its edge. Graphite ring 306 contains a silicon carbide coating (with additional optional coating of silicon) for oxidation resistance and preventing process contamination from graphite. It is possible to make the heat shield ring using another clean photon-absorbing material such as polycrystalline or single-crystal silicon. In a general sense, heat shield ring 306 is a photon-absorbing material that, as long as it absorbs photon, optical energy will be reradiated back to the edge of semiconductor wafer 60 to eliminate the edge loss effects. The ring may also be made of an infrared reflective material with little direct light absorption such as quartz. The combination of graphite ring 306 and lamp module 130 provide extended flexibility for temperature and process uniformity control across the semiconductor wafer 60. Graphite ring 306 may be a fraction of a millimeter in thickness or it may be as thick as 3–5 millimeters. The graphite ring 306 outer diameter is not critical and may be approximately ½ to 1 inch greater than the inner diameter. Graphite ring 306 also conforms to the shape of semiconductor wafer 60. In particular, where semiconductor wafer 60 has a major flat edge 308, graphite ring 306 includes flat edge 310 to maintain a constant distance from the edge of semiconductor wafer 60. The heat shield ring may be mounted in the same plane as the wafer, above the wafer, or below the wafer in the process chamber.

TABLE 1

| P1 = 54<br>P2 = 0.950<br>P3 = 1.225<br>TIME (sec) | Power zone setting (no physical units) | | | |
|---|---|---|---|---|
| | T1 | T2 | T3 | T4 |
| 60 | 491 | 500 | 496 | 504 |
| 90 | 565 | 564 | 567 | 565 |
| 180 | 591 | 589 | 591 | 590 |
| 240 | 608 | 606 | 2608 | 607 |
| 300 | 628 | 627 | 629 | 628 |

Table 1 shows 37 kilowatt lamp (3-zone illuminator) temperature uniformity results using the combination of semiconductor wafer 60, multiple bonded thermocouple sensing points T1, T2, T3, and T4 and graphite ring 360. Semiconductor wafer 60 is a 150-mm diameter wafer containing bonded thermocouple points T1, T2, T3, and T4 distributed between the center and edge of semiconductor wafer 60. All tests shown in the following table were run using 900 sccm of hydrogen within process chamber 126 at various pressures. In Table 1, the adjustable, lamp in the center lamp zone was placed in its closest vertical position with respect to the optical/vacuum quartz window and graphite ring 306 was placed in the same plane as semiconductor wafer 60 within process chamber 126. Power settings for the lamp zone power supplies are shown in Table 1. (Optimized settings shown in arbitrary units). Thermocouple readings were taken at 60, 90, 180, 240, and 300 seconds after turning on all three power zones on lamp module 130. Pressure within process chamber 126 was 0.5 Torr for a wafer temperature ranging from 500° to 628° C. Table 1 shows that at 300 seconds following activating lamp module 130, the temperature across semiconductor wafer 130 ranges from 627° C. to 629° C. This provides a maximum radial temperature deviation of less than ±1° C. across the semiconductor wafer assuming a cylindrically symmetrical wafer temperature distribution. The lamp zone power settings were optimized for the best uniformity after 300-sec into wafer heating.

TABLE 2

| P1 = 54<br>P2 = 0.935<br>P3 = 1.250<br>TIME (sec) | Power zone settings (arbitrary units) | | | |
|---|---|---|---|---|
| | T1 | T2 | T3 | T4 |
| 60 | 527 | 535 | 539 | 541 |
| 90 | 580 | 579 | 586 | 583 |
| 180 | 605 | 605 | 609 | 609 |
| 240 | 622 | 621 | 625 | 624 |
| 300 | 636 | 635 | 638 | 637 |

Table 2 provides similar data for the situation where center lamp zone 198 is again placed at its closest position to the optical quartz window 128. Pressure within process chamber 126, again, is 0.5 Torr and power supplies 1, 2 and 3 have power settings as shown. Power settings shown for power supplies 1, 2 and 3 are in arbitrary units and do not indicate kilowatts or other power units. They are simply the remote setting signal levels. They are, however, reproducible settings for center zone lamps, middle zone lamps 192, and outer zone lamps. Readings from Table 2 indicate radial temperature profiles 60–300 seconds after energizing lamp module 130. These data also show similar lack of variation among the thermocouple points T1, T2, T3 and T4 with 3° C. maximum temperature variation. The radial wafer temperature distribution between T1 and T4 is 636°, 635°, 638° and 637° C. (after 300 sec.). The lamp power settings had been optimized (approximately) for uniform wafer heating, 300-sec after turning the lamps on.

TABLE 3

| P1 = 70<br>P2 = 0.605<br>P3 = 1.650<br>TIME (sec) | Power zone settings (arbitrary units) | | | |
|---|---|---|---|---|
| | T1 | T2 | T3 | T4 |
| 60 | 590 | 591 | 597 | 600 |
| 90 | 661 | 658 | 664 | 668 |
| 180 | 679 | 675 | 680 | 683 |
| 240 | 691 | 686 | 691 | 695 |
| 300 | 703 | 697 | 702 | 705 |

As another example, Table 3 shows experimental conditions similar to that of Tables 1 and 2, except that in this instance, graphite ring 306 was placed at a plane which was 0.2 inches away from the plane of semiconductor wafer 60. Power settings to the lamp zone power supplies are as shown. Table 3 shows that at the point of temperature stabilization, i.e., at 300 seconds following the initiation of optical energy from lamp module 130, a greater temperature variation exists as a result of the different position of graphite ring 306 with respect to semiconductor wafer 60. Thus, while the circular zones of light module 130 provide significant improvements in temperature uniformity across the surface of semiconductor wafer 60, the addition of graphite ring 306 further enhances capabilities to provide wafer temperature uniformity.

FIG. 7 shows a block diagram for achieving dynamic semiconductor wafer temperature and process uniformity control using the combination of the multi-point temperature sensor of the Pyrometry Patent together with multi-zone lamp module 130 of the present invention (Example given for a four-zone lamp) and face-down wafer processing. In its normal use, with face-down wafer processing multi-zone lamp 130 sits above reactor process chamber 126 and is configured to receive multi-point pyrometer light pipes 318 within the module itself. Fiber probe sensors, FB1, FB2, FB3, and FB4 interface to electrical cables 320, 322, 324, and 326, respectively that provide semiconductor wafer temperature measurements at various points on wafer surface. Output electrical signal 320 corresponding to fiber bundle sensor FB1, goes to multi-zone controller 152 which communicates with process control computer 150 through communication link 328. Temperature sensors FB2, FB3, and FB4 provide measurement signals which are sent via lines 322, 324, and 326 to process control computer 150 (via analog-to-digital converters). In response to signals from multi-zone controller 152 and input lines 322, 324, and 326, process control computer sends power setpoint signals to power supplies, PS1 286, PS2 288, PS3 290, and PS4 292. These power supplies provide adjustable electrical power channels to multi-zone lamp 130 via lines 330, 332, 334, and 336 respectively.

Although FIG. 7 shows four fiber-optic temperature sensors, more than that number is permissible for pyrometric temperature readings of the semiconductor wafer (as an example see FIG. 5 where the multi-zone RTP system has five sensor channels with a 5-zone illuminator). Moreover, the number of fiber-optic temperature sensors for semiconductor wafer temperature sensing does not have to be equal to the number of power supplies for lamp zones for multi-zone lamp 130. However, sensing of semiconductor wafer temperature with one or more sensors and directly linking those pyrometer measurements to power supply inputs via hardware or software PID controllers is necessary for the real-time control and operation of the system of FIG. 7.

What is claimed is:

1. A multizone rapid thermal processing system for processing a semiconductor device, the semiconductor device having a face on which an electronic device is fabricated and a backside, the system comprising:

a processing chamber for establishing a semiconductor wafer device fabrication environment;

an optically reflective gas injector for injecting a process gas into the semiconductor device fabrication environment;

a semiconductor device holding mechanism for holding the semiconductor device in the semiconductor device fabrication environment; and a multizone illuminator positioned in association with said process chamber for illuminating the backside of the semiconductor device, said multizone illuminator comprising a plurality of concentric circles of heating lamps to form multiple zones of heating to increase semiconductor device temperature uniformity during rapid semiconductor thermal processing.

2. The apparatus of claim 1, wherein said semiconductor device holding mechanism comprises a wafer receiving mechanism for receiving the semiconductor wafer in a face down orientation and said multizone illuminator is further positioned in association with said process chamber for illuminating the semiconductor wafer backside from the top downward.

3. The apparatus of claim 1, wherein said gas injector comprises an optically reflective showerhead assembly facing the semiconductor device frontside.

4. The apparatus of claim 1, wherein said process chamber further comprises componentry for establishing an essentially atmospheric pressure semiconductor device fabrication environment.

5. The apparatus of claim 1, wherein said process chamber further comprises vacuum system componentry for establishing a vacuum semiconductor device fabrication environment.

6. A method of forming a multizone illuminator rapid thermal processing system for fabricating a semiconductor device, the semiconductor device having a face on which to form an electronic structure and a backside, the method comprising the steps of:

forming a process chamber for establishing a semiconductor device fabrication environment for rapid thermal processing;

forming an optically reflective gas injector for injecting a process gas into the semiconductor device fabrication environment;

forming a semiconductor device holding mechanism for holding the semiconductor device in said process chamber;

forming a multizone illuminator positioned in association with said processing chamber for illuminating and heating the backside of the semiconductor device, said multizone illuminator comprising a plurality of concentric circles of heating lamps to form multiple zones of heating to increase semiconductor device temperature uniformity during rapid semiconductor thermal processing.

7. The method of claim 6, further comprising the step of forming a wafer receiving mechanism for receiving the semiconductor wafer in a face down orientation and said multizone illuminator is further positioned in association with said process chamber for illuminating the semiconductor wafer backside from the top downward.

8. The method of claim 6, wherein said gas injector forming step further comprises the step of forming an optically reflective showerhead gas injector facing the semiconductor device frontside for injecting process gas into the semiconductor device fabrication environment.

9. The method of claim 6, wherein said gas injector forming step further comprises the step of forming a showerhead gas injector as an optically reflective multizone showerhead gas injector for injecting process gas into the semiconductor device fabrication environment.

10. A method for performing a rapid thermal process on a semiconductor device, the semiconductor device having a face on which to form as electronic structure and a backside, the method comprising the steps of:

establishing a semiconductor device fabrication environment in a process chamber;

injecting a process gas into the semiconductor device fabrication environment;

holding the semiconductor device in the process chamber;

illuminating the backside of the semiconductor device using a multizone illuminator having a plurality of concentric circles of heating lamps, said multizone illuminator positioned in association with the process chamber for performing the rapid thermal process on the semiconductor device; and optically reflecting the illumination at the face of the semiconductor device.

11. The method of claim 10, further comprising the step of receiving the semiconductor wafer in a face down orientation and said multizone illuminator is further positioned in association with said process chamber for illuminating the semiconductor wafer from the top downward.

12. The method of claim 10, further comprising the step of injecting the process gas into the semiconductor device fabrication environment using an optically reflective showerhead gas injector facing the semiconductor device frontside.

13. The method of claim 10, further comprising the step of injecting the process gas into the semiconductor device fabrication environment using a multizone showerhead gas injector.

14. The method of claim 10, further comprising the step of establishing the semiconductor device fabrication environment as a vacuum.

15. The apparatus of claim 1, wherein said gas injector comprises an optically reflective gas showerhead injector assembly having an optically reflective plate facing the multizone illuminator.

16. The apparatus of claim 1, further comprising a quartz window coupled to the processing chamber between the multizone illuminator and the semiconductor device.

17. The apparatus of claim 1, further comprising a heat shield ring coupled to the processing chamber at an outer diameter and adjacent the semiconductor device at an inner diameter, the heat shield ring operable to act as a radiation shield to reduce the amount of thermal energy lost from the semiconductor device.

18. The method of claim 6, wherein the step of forming said gas injector further comprises forming an optically reflective gas showerhead injector assembly having an optically reflective plate facing the multizone illuminator.

19. The method of claim 10, wherein the step of forming said gas injector further comprises forming an optically reflective gas showerhead injector assembly having an optically reflective plate facing the multizone illuminator.

* * * * *